United States Patent
Blennius et al.

(10) Patent No.: US 10,955,199 B2
(45) Date of Patent: Mar. 23, 2021

(54) COOLING DEVICE WITH EVENLY DISTRIBUTED AND DIRECTED COOLING EFFECT FOR HIGH HEAT FLUX AND DEAERATION FUNCTIONALITY

(71) Applicant: SAAB AB, Linköping (SE)

(72) Inventors: Martin Blennius, Kullavik (SE); Hans Falk, Mölndal (SE)

(73) Assignee: SAAB AB, Linköping (SE)

( * ) Notice: Subject to any disclaimer, the term of this patent is extended or adjusted under 35 U.S.C. 154(b) by 36 days.

(21) Appl. No.: 16/305,740

(22) PCT Filed: May 30, 2016

(86) PCT No.: PCT/SE2016/050505
§ 371 (c)(1),
(2) Date: Nov. 29, 2018

(87) PCT Pub. No.: WO2017/209665
PCT Pub. Date: Dec. 7, 2017

(65) Prior Publication Data
US 2019/0368827 A1     Dec. 5, 2019

(51) Int. Cl.
*F28F 3/12* (2006.01)
*F28F 27/02* (2006.01)
(Continued)

(52) U.S. Cl.
CPC .............. *F28F 3/12* (2013.01); *F28F 27/02* (2013.01); *H05K 7/20272* (2013.01);
(Continued)

(58) Field of Classification Search
CPC .................................... F28F 27/02; F28F 3/12
(Continued)

(56) References Cited

U.S. PATENT DOCUMENTS

| 4,188,996 A | 2/1980 | Pellant et al. |
| 4,989,776 A * | 2/1991 | Hepburn ............ B23K 1/20 228/118 |

(Continued)

FOREIGN PATENT DOCUMENTS

| WO | 0223966 A2 | 3/2002 |
| WO | 2013057952 A1 | 4/2013 |

OTHER PUBLICATIONS

International Search Report and Written Opinion dated Feb. 22, 2017 in corresponding international application No. PCT/SE2016/050505 (12 pages).

(Continued)

*Primary Examiner* — Henry T Crenshaw
(74) *Attorney, Agent, or Firm* — Venable LLP; Jaffri A. Kaminski (57) ABSTRACT

A cooling device for providing cooling capability of adjacent structures comprises a hollow chamber, an inlet and a chamber outlet, wherein the inlet, the chamber and the chamber outlet are configured such that fluid flow may enter via the inlet, pass through the chamber, and exit via the chamber outlet. The chamber is divided into a distribution chamber and a cooling chamber by a partitioning member, wherein the inlet is fluidly connected to the distribution chamber and the chamber outlet is fluidly connected to the cooling chamber. The partitioning member comprises at least a first and a second constriction passage, wherein the first constriction passage has a first predefined cross sectional flow area and the second constriction passage has a second predefined cross sectional flow area. The sizes of the predefined at least first and second cross sectional flow areas of the at least first and second constriction passages are controllable, whereby the distribution of fluid flow from the (Continued)

distribution chamber to the cooling chamber via the respective constriction passage is controllable.

14 Claims, 6 Drawing Sheets

(51) Int. Cl.
*H05K 7/20* (2006.01)
*H01Q 1/02* (2006.01)

(52) U.S. Cl.
CPC ....... *F28F 2240/00* (2013.01); *F28F 2265/18* (2013.01); *H01Q 1/02* (2013.01)

(58) Field of Classification Search
USPC .......................................................... 165/8.4
See application file for complete search history.

(56) References Cited

U.S. PATENT DOCUMENTS

| | | | | |
|---|---|---|---|---|
| 5,239,200 A | * | 8/1993 | Messina | H01L 23/473 165/104.33 |
| 5,269,372 A | * | 12/1993 | Chu | F28F 3/12 165/185 |
| 5,915,463 A | | 6/1999 | Romero et al. | |
| 2004/0062006 A1 | | 4/2004 | Pfeifer et al. | |
| 2007/0091569 A1 | * | 4/2007 | Campbell | H01L 23/4338 361/699 |
| 2007/0289718 A1 | | 12/2007 | McCordic et al. | |
| 2010/0038051 A1 | * | 2/2010 | Behrens | F28F 13/003 165/41 |
| 2012/0048515 A1 | * | 3/2012 | Bhunia | H01L 23/3735 165/104.25 |
| 2012/0097374 A1 | | 4/2012 | Altman | |
| 2013/0084433 A1 | * | 4/2013 | Ernst | E04F 13/0736 428/174 |
| 2015/0289413 A1 | * | 10/2015 | Rush | H05K 7/20336 361/700 |
| 2017/0332514 A1 | * | 11/2017 | Saito | F25D 9/00 |
| 2019/0368827 A1 | * | 12/2019 | Blennius | B33Y 80/00 |

OTHER PUBLICATIONS

Extended European Search Report in corresponding European application No. 16904180.3 dated Dec. 16, 2019 (7 pages).

* cited by examiner

COOLING DEVICE WITH EVENLY DISTRIBUTED AND DIRECTED COOLING EFFECT FOR HIGH HEAT FLUX AND DEAERATION FUNCTIONALITY

CROSS-REFERENCE TO RELATED APPLICATIONS

This application is a U.S. National Stage application of PCT/SE2016/050505, filed May 30, 2016 and published on Dec. 7, 2017 as WO/2017/209665, the contents of which are hereby incorporated by reference in their entireties.

TECHNICAL FIELD

The present disclosure relates to a cooling device for controlling the temperature of electronic components such as e.g. components of a circuit board. The present disclosure may e.g. be applied in electronically steerable antennas in order to control temperature of high power components. Although the present disclosure will be described with respect to an electrically steerable antenna, the present disclosure is not restricted to this particular use, but may also be used in other applications where temperature control of e.g. electrical components is required.

BACKGROUND ART

The increased use of electronically steerable antennas, generally referred to as AESAs (Active Electronically Scanned Arrays), involves new challenges e.g. in terms of cooling of e.g. circuit boards. The often complex design of AESAs has the effect that the availability of cooling fluid is restricted and that the flow rates often are relatively low. This combined with the fact that AESA constructions generally comprises high power components with significant power flows, whereby significant and concentrated heat is developed, makes cooling problematic.

The compact design may also be a problem due to that the cooling conduits may be narrow and comprise numerous sharp turns. This in turn may be problematic if deposits or residues in, or formed by, the cooling fluid gets stuck in the cooling conduits or restrict the flow of cooling fluid in any other way.

Another aspect that has to be considered is that ESA installations often are required to manage that the orientation of the ESA installation changes rapidly. This is particularly important for aircraft applications wherein the application, at least for shorter periods of time, may even be turned upside down. A problem that may arise due to rapid changes of orientation is that air pockets may be formed whereby locally the cooling capability may be completely lost, which in turn might result in function failure.

Thus, there is room for further improvements.

SUMMARY OF THE INVENTION

An object of the present invention is to provide a cooling device which seeks to mitigate, alleviate, or eliminate one or more of the above identified deficiencies and disadvantages singly or in any combination. The object is achieved by a cooling device according to claim 1. Various exemplary embodiments of the present invention are set forth by the appended dependent claims as well as by the following description and the accompanying drawings. The present invention also refers to a method for controlling cooling properties of a cooling device.

During operation of high power electrical components, such as e.g. circuit boards of electronically steerable antennas, significant heat is generated. In order for such components to work properly, not be damaged themselves or not damage surrounding structures it is important that the generated heat is dissipated and that the components are properly cooled down. In order for such cooling to be as efficient as possible it is desirable that the cooling capability can be directed to the locations where most heat is generated, thus to where the need of heat dissipation is most significant.

The present invention refers to a cooling device for providing cooling capability of adjacent structures, wherein the cooling device comprises a hollow chamber, an inlet and a chamber outlet. The inlet, the chamber and the chamber outlet are configured such that fluid flow may enter via the inlet, pass through the chamber and exit via the chamber outlet. The chamber is further divided into a distribution chamber and a cooling chamber by a partitioning member. The inlet is fluidly connected to the distribution chamber and a chamber outlet is fluidly connected to the cooling chamber. The partitioning member comprises at least a first and a second constriction passage, wherein the first constriction passage has a first predefined cross sectional flow area and the second constriction passage has a second predefined cross sectional flow area. The sizes of the predefined first and second cross sectional flow areas of the first and second constriction passages are controllable, whereby the distribution of fluid flow from the distribution chamber to the cooling chamber via the respective constriction passage is controllable.

The size of a predefined cross sectional flow area of a constriction passage is critical for controlling the volume of fluid that is able to pass through respective constriction passage. Thus, by controlling the size of the predefined cross sectional flow area the fluid flow allowed to pass can be controlled.

The distribution chamber is configured to receive fluid flow provided via the inlet. The distribution chamber is configured such that the fluid flow entering the distribution chamber adopts a slowly flowing, essentially laminar flow. However, at narrow passages and constrictions the flow may adopt turbulent flow. The flow rates of fluid flow are limited, e.g. due to limited access to (cooling) fluid, small dimensions of conduits etc. and restricted space, which may cause the fluid flow in the distribution chamber and the cooling chamber to be predominantly laminar. At laminar flow a boundary layer, where the fluid flow is essentially stationary, is formed. The formation of a boundary layer has negative impact on the heat transfer between the fluid flow and the walls of the distribution/cooling chamber. As will be discussed more in detail later on, it is preferred that the boundary layer formed is as small as possible, hence surface enlarging elements are provided to interrupt the laminar flow.

The chamber outlet is fluidly connected to an outlet by an outlet conduit. Thereby the outlet of the cooling device is not restricted to be arranged at an essentially opposite side of the inlet.

A fluid flow, preferably of cooling fluid, entering through the inlet will enter the distribution chamber having a certain flow direction. The flow direction may be dependent on a flow direction provided by the design of the inlet, and/or on the direction, design etc. of a conduit, pipe or similar feeding the fluid flow the to the inlet. As mentioned above, once having entered the distribution chamber the fluid flow will be laminar. Since the fluid flow entering the distribution chamber has a certain flow direction this will give rise to a certain flow distribution within the distribution chamber. An uneven or incorrectly configured laminar flow in the distribution chamber may have the effect that a predominant portion of the fluid flow may enter one part of the cooling chamber whereby another part of the cooling chamber may be provided with less or no fluid flow from the distribution chamber. This in turn may have the effect that the cooling device will show uneven cooling capability.

By, in a controlled manner, controlling the fluid flow through the constriction passages by controlling the sizes of respective constriction passage, and thereby being able to control the distribution of fluid flow over respective constriction passage, it is possible to ensure that the fluid flow is distributed to the cooling chamber, via the constriction passages, in a manner providing sufficient cooling capability even at very low fluid flows of cooling fluid.

When herein referring to fluid flow what is considered first and foremost is a suitable cooling fluid such as e.g. glycol, water, polyalphaolefin, oil or a mixture comprising any of these fluids. However, it is also possible to use a fluid, first and foremost not considered to be a cooling fluid, but still showing properties necessary for being a cooling fluid, as fluid of the fluid flow. For certain applications it may also be possible to use a gas such as e.g. air. Depending on current implementation or application of the cooling device the fluid flow may be constant or vary.

According to yet other aspects of the present invention the partitioning member additionally comprises at least a third constriction passage, wherein the third constriction passage has a third predefined cross sectional flow are. The sizes of the predefined first, second and third cross sectional flow areas of the first, second and third constriction passages are controllable, whereby the distribution of fluid flow from the distribution chamber to the cooling chamber via the respective constriction passage is controllable.

Three constriction passages has proven to be a suitable number of constriction passages in order to obtain a suitable distribution of fluid flow from the distribution chamber to the cooling chamber for a specific embodiment of a cooling device. For other embodiments two, or more than three, constriction passages may be a suitable number of constriction passages.

The fundamental functionality provided by the cooling device of the present invention may be considered as; even if the cooling device just has one inlet and one outlet, which in many cases is preferable from an assembly and replacement perspective, the distribution of fluid flow (as mentioned, preferably of a cooling fluid) at the position of the cooling device where it is most important that sufficient cooling is provided (at the position of the cooling structure), will be perceived as if being provided by multiple inlets (due to the multiple constriction passages of the partitioning member) through which e.g. essentially the same amount of fluid flow is provided, wherein a more even cooling can be provided essentially without a temperature gradient (a declining cooling temperature) over the cooling structure.

Generally, the more constriction passages the partitioning member is provided with the more even distribution of fluid flow from the distribution chamber to the cooling chamber is possible to obtain, and over a larger area. This will be explained more in detail in the following detailed description.

According to yet other aspects of the present invention the predefined cross sectional flow area of the constriction passages are configured to control fluid flow through respective constriction passage such that fluid flow through respective constriction passage is essentially equal in terms of flow rate. Thereby fluid flow from the distribution chamber to the cooling chamber will be essentially evenly distributed over the constriction passages.

Such aspects of the present invention has the exemplary advantage that the fluid flow will be distributed to the cooling chamber evenly over the constriction passages whereby even cooling capability may be provided. According to some aspects of the present invention this is obtained by that the predefined cross sectional flow areas of the constriction passages are essentially the same.

An exemplary advantageous functionality provided by the present invention is the possibility to direct and concentrate the cooling capability of the cooling device to an area adjacent to where particularly heat sensitive components are arranged or where significant heat is generated. This functionality is provided by that the cooling device comprises a particular cooling structure.

According to aspects of the present invention the cooling chamber comprises a cooling structure, wherein the cooling structure is formed by a number surface enlarging elements. Further, the predefined cross sectional flow areas of the constriction passages are configured such that the fluid flow distributed from the distribution chamber to the cooling chamber is essentially evenly distributed over the surface enlarging elements of the cooling structure by means of the constriction passages.

The area of the surface at which the cooling chamber and the fluid flow interact is proportional to the cooling capability. The surface enlarging elements provides such that the area of the surface at which the cooling chamber and the fluid flow interact, whereby heat transfer can occur, increases and additionally improves the heat transfer between the fluid flow and the cooling chamber of the cooling device by counteracting that a significant boundary layer is formed.

The larger the area of the surface at which the fluid flow and sides, walls etc. of the cooling chamber of the cooling device is meet, the more heat can be transferred from the cooling chamber to the fluid flow, whereby cooling of any adjacent structure by means of the cooling device is enabled.

The presence of surface enlarging elements further provides such that the laminar flow of the fluid flow, which is formed in the cooling chamber once the fluid flow enters the cooling chamber, is disturbed. Heat transfer between a fluid flowing past a surface is larger before a boundary layer of a laminar flow is formed. Thereby, for improved heat transfer between the fluid flow and surrounding structure it is advantageous to disturb the fluid flow as soon as possible as/before laminar fluid flow is formed, or at least to keep the boundary layer as thin as possible. Thus, the surface enlarging elements are preferably arranged at a distance from respective constriction passage such that the surface enlarging elements disturb the laminar flow, thereby improving heat transfer.

Distributing the fluid flow evenly over the surface enlarging elements of the cooling structure contributes to that the cooling structure will have an essentially even temperature, thereby providing an essentially even cooling of e.g. a circuit board arranged adjacent to the cooling structure of the cooling device.

Obviously, the whole cooling device, which is circulated with a fluid flow, provides cooling capability, but the cooling structure of the cooling device may provide a better controllable and, as will be discussed later, possibly over time more consistent, cooling capability.

The cooling chamber of the present invention is preferably, but not limited to being, in form of an essentially flat chamber. Thus, according to further aspects of the present invention the chamber is defined by:
a first inner surface and a second inner surface, wherein the first and second inner surfaces are essentially parallel, and a circumferential inner wall extending from an outer edge of the first inner surface to an outer edge of the second inner surface, and connecting the first inner surface to the second inner surface, such that an essentially planar hollow chamber is formed, wherein
the surface enlarging elements extends from the first inner surface of the planar chamber to the second inner surface of the planar chamber.

Thus, the cooling device can be defined as having opposite front and rear end walls which define a length, opposite edge walls which define a width and opposite sidewalls which define a thickness.

An essentially flat cooling device is a suitable shape for applications where the cooling device is provided to cool down e.g. a circuit board. Even if the whole surface of the cooling device provides cooling properties, if provided to cool down a circuit board, which then is considered to be a structure arranged adjacent to the cooling device, it is preferable that the location of the cooling structure, which is the part of the cooling device that provides most efficient and even cooling, is arranged adjacent to the location of the components of the circuit board that e.g. are most temperature sensitive or that generates most heat.

According to other aspects of the present invention the surface enlarging elements are formed as essentially circular cylinders extending from the first inner surface to the second inner surface of the chamber. According to yet other aspects of the present invention the surface enlarging elements are formed as essentially quadratic blocs extending from the first inner surface to the second inner surface of the chamber.

This can also be expressed as that the cooling device comprises first and second, essentially parallel limiting sheets of metal (with a respective inner surface), wherein the surface enlarging elements are formed as cylinders or blocs extending from the first sheet to the second sheet.

Surface enlarging elements in form of circular cylinders are one advantageous exemplary embodiment of surface enlarging elements. Surface enlarging elements in form of essentially quadratic blocs are another advantageous exemplary embodiment of surface enlarging elements.

The surface enlarging element may also be of at least one shape from a group of shapes consisting of: an hourglass, a helix or a barrel, wherein the shape is extending from the first inner surface to the second inner surface of the chamber. As is apparent for a person skilled in the art, also other shapes which increases the surface area exposed to the cooling fluid, thus which improves the cooling capability, are possible.

The most suitable distance between the outlet of respective constriction passage and the surface enlarging elements is e.g. dependent on current, the most frequently occurring or an average fluid flow.

According to other aspects of the present invention the cooling device further comprises:
a gas drainage cavity, wherein the gas drainage cavity is arranged such that gas in the fluid flow is collected in the gas drainage cavity,
an outlet, wherein an outlet conduit fluidly connects the outlet to the chamber outlet, and
a deaeration device comprising a deaeration conduit provided with a venturi tube, wherein the deaeration device is fluidly connected to the gas drainage cavity at one end of the deaeration conduit and fluidly connected to the outlet conduit at the other end of the deaeration conduit.

The deaeration functionality is preferably configured to be useful when the cooling device is oriented such that there is an imminent risk that gas bubbles are formed or aggregated in the cooling fluid. This is an imminent risk when the outlet is located lower than the inlet, especially an imminent risk when the outlet is located at the vertically lowest point of the cooling device. When referring to that gas in the fluid flow what is considered is e.g. gas which may have entered the cooling system somewhere else and been transported to the cooling device, gas formed in the fluid to fluctuations in temperature, pressure and/or orientation, gas present within the system from assembling the system or gas in the actual fluid. The gas referred to may e.g. be air.

When referring to that the gas drainage cavity is arranged such that gas in the fluid flow is collected in the gas drainage cavity what is considered is that the when the cooling device is oriented such that the gas drainage cavity is positioned in an elevated position in relation to the outlet in a vertical direction, gas bubbles formed in the fluid may rise to and be collected in the gas drainage cavity.

The gas drainage cavity is further preferably located close to the cooling structure such that deaeration of the cooling structure, which is the area of the cooling device where formation of an air pocket will have most severe effect, is prevented.

The deaeration functionality provided by the deaeration device has the exemplary advantage that the when gas in the fluid flow aggregates and form bubbles such bubbles are collected in the gas drainage cavity and removed by means of suction by the deaeration device whereby gas pockets are prevented from being formed. Formation of gas pockets will severely deteriorate the cooling capability, locally, of the cooling device.

The venturi tube will more or less continuously be flushed with drained gas and/or fluid that are discharged. It is important that the flow rate in the conduit is sufficiently high, or else too low under pressure is formed providing the sucking effect of the venturi tube. Thus, the venturi tube is preferably arranged at a position of the conduit where the flow rate is as high as possible.

The cooling device preferably has an inner guiding structure, wherein the inner wall of the chamber, thus the walls of the distribution chamber and the cooling chamber, forms the inner guiding structure. The guiding structure is preferably arranged such that, when the gas drainage cavity is arranged such that gas in the fluid flow rises upwards and is collected and aggregated in the gas drainage cavity the guiding structure is formed such that no cavities are formed where gas may be detained.

According to other aspects of the present invention the distribution chamber comprises at least one spacer element, or the cooling chamber comprises at least one spacer element, or the distribution chamber and the cooling chamber comprise at least one spacer element each. The spacer elements extend from the first inner surface to the second inner surface of the chamber and thereby provide mechanical stability to the cooling device.

When a fluid such as a cooling fluid flows through a chamber such as of the cooling device and is exposed to temperature and possibly pressure variations it is possible that deposits are formed. Such deposits may aggregate and ultimately clog small conduits or narrow passages, which obviously is desirable to avoid. Thus, according to aspects of the present invention the plurality of surface enlarging elements are separated by a distance of at least 0.8 mm and the constriction passages have a cross sectional area which in no planar extension is less than 0.8 mm. According to other aspects of the present invention the plurality of surface enlarging elements are separated by a distance of at least 0.5 mm and the constriction passages have a cross sectional area which in no planar extension is less than 0.5 mm. The minimum distance is e.g. dependent on the purity level of selected cooling fluid, the susceptibility of components of the cooling system, such as pumps etc., to release rubber residues etc.

One possible approach in order to improve the purity level of the cooling fluid is to integrate a filter at the inlet, or at other suitable position within the cooling device, with a pore size smaller than 0.5 mm.

The chamber of the cooling device is made of a heat conductive material having sufficiently high W/mC value. According to aspects of the present invention the heat conductive material may be aluminium, graphene composite copper or an alloy comprising aluminium or copper. An example of a suitable material is e.g. AL EN-AW-6082-T6, which discloses suitable properties in terms of e.g. corrosion, durability, processing and conductivity.

Yet an exemplary advantageous functionality provided by the present invention is that the cooling structure additionally provides a buffering effect. The surface enlarging elements, especially if they are solid, thus if the surface enlarging elements are formed of heat conductive material completely through respective element, increases the total mass of heat conductive material at the position of the cooling structure. This has the effect that even if an air pocket is formed at the cooling structure, whereby the cooling effect provided by the fluid flow of cooling fluid is lost, the additional mass of the surface enlarging elements will maintain the cooling effect provided by the cooling structure for an additional, limited period of time. This is first and foremost important for embodiments of cooling devices without the deaeration functionality.

According to yet other aspects of the present invention the chamber is manufactured by means of 3D printing. 3D printing as manufacturing method provides good thermal properties.

According to other aspects of the present invention the hollow chamber comprises a chamber body and a chamber closure, wherein the chamber body and the chamber closure are configured to fit together whereby a hermetically sealed hollow chamber is formed. Accordingly, according to aspects of the present invention the chamber body and the chamber closure are manufactured by means of 3D printing.

According to other aspects of the present invention the chamber body and the chamber closure are soldered together by means of salt-bath dip brazing. Salt-bath dip brazing is an example of a suitable manufacturing method for soldering together the chamber body and the chamber closure. Other suitable manufacturing methods are e.g. vacuum brazing, soldering by means of using an ion-beam or soldering by means of using lasers.

The present invention also relates to methods for controlling cooling properties of a cooling device according to any of, or a combination of, aspects of cooling devices previously disclosed herein, wherein according to aspects of the present invention the method for controlling cooling properties of a cooling device, wherein the cooling device comprises:
  a hollow chamber, wherein the chamber is divided into a distribution chamber and a cooling chamber by a partitioning member,
  an inlet, wherein the inlet is fluidly connected to the distribution chamber of the chamber,
  a chamber outlet, wherein the chamber outlet is fluidly connected to the cooling chamber of the chamber,
  at least a first and a second constriction passages, wherein the at least first and second constriction passages are arranged in the partitioning member, and wherein the first constriction passage has a first predefined cross sectional flow area and the second constriction passage has a second predefined cross sectional flow area, and
  a cooling structure provided in the cooling chamber, wherein the cooling structure is formed by a number surface enlarging elements,
and wherein the inlet, the chamber and the chamber outlet are configured such that:
  a fluid may enter via the inlet and flow into the distribution chamber, wherein in the distribution chamber an essentially laminar fluid flow is formed, wherein subsequently
  the fluid may pass through the constriction passages of the partitioning member and enter the cooling chamber, and finally
  the fluid may be discharged from the cooling chamber via the chamber outlet,
wherein the method for controlling fluid distribution comprises the method steps of:
  controlling the distribution of fluid flow from the distribution chamber to the cooling chamber by controlling the size of at least the first and the second predefined cross sectional flow areas of at least the first and the second constriction passages, and
  directing fluid flow out from respective constricted passage at the cooling structure,
such that fluid flow is evenly distributed over the surface enlarging elements of the cooling structure whereby the cooling structure may provide an essentially even cooling.

According to yet other aspects of methods the present invention the constriction passages are at least three, wherein the third constriction passage has a predefined third cross sectional flow area. According to yet other aspects of methods the present invention the fluid flow is essentially evenly distributed, in terms of flow rate and flow volume, over the constriction passages.

According to aspects of the present invention the present invention also comprises methods for deaeration of a cooling device according to any of, or a combination of, aspects of cooling devices, previously disclosed herein, wherein the cooling device further comprises:
  a gas drainage cavity, wherein the gas drainage cavity is arranged such that gas in the fluid flow is collected in the gas drainage cavity,
  an outlet, wherein an outlet conduit fluidly connects the outlet to the chamber outlet, and
  a deaeration device comprising a deaeration conduit provided with a venturi tube, wherein the deaeration device is fluidly connected to the gas drainage cavity at one end of the deaeration conduit and fluidly connected to the outlet conduit at the other end of the deaeration conduit,
wherein, when a fluid is flowing through said cooling device, the method for deaeration comprises the method steps of:
  creating a suction by means of the venturi tube, such that gas formed in the fluid is collected at the gas drainage cavity and removed from the gas drainage cavity by means of suction.

The number of constriction passages, the extension of the partitioning member, and thus the distance over which the constriction passages are distributed, as well as the size and design of the chamber in terms of e.g.: shape, thickness, width, length, size of distribution chamber versus size of cooling chamber, positioning, shape and number of surface enlarging elements of the cooling structure etc. is first and foremost dependent on the implementation of the cooling device, and related to the specific implementation, the specific requirements in terms of available space, required cooling capability, required positioning and extension of possibly particularly important area for cooling (to which the cooling structure preferably is arranged), requirements in terms of mechanical stability etc. To give an example, when implemented for providing cooling capability to a circuit board the cooling device may e.g. be essentially of the same shape as the circuit board, have a cooling structure which is positioned adjacent to the most heat sensitive and/or most heat generating components of the circuit board and have constriction passages and surface enlarging elements which provide sufficient cooling in relation to the most heat sensitive and/or most heat generating components of the circuit board.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred examples and modes of operation of the present invention. However, the invention should be regarded as illustrative rather than restrictive, and not as being limited to the particular examples discussed above. The different features of the various examples of the invention can be combined in other combinations than those explicitly described. It should therefore be appreciated that variations may be made in those examples by those skilled in the art without departing from the scope of the present invention as defined by the following claims.

BRIEF DESCRIPTION OF THE DRAWINGS

With reference to the appended drawings, below follows exemplary embodiments of the present invention.

DETAILED DESCRIPTION

The following description of exemplary embodiments of the present invention is presented only for purposes of illustration and should not be seen as limiting. The description is not intended to be exhaustive and modifications and variations are possible in the light of the above teachings, or may be acquired from practice of various alternative embodiments of the present invention. The examples discussed herein were chosen and described in order to explain the principles and the nature of various exemplary embodiments and its practical application to enable one skilled in the art to utilize the exemplary embodiments in various manners, and with various modifications, as are suited to the particular use contemplated. It should be appreciated that the aspects presented herein separately may be practiced in any combination with each other unless otherwise explicitly is stated.

Reoccurring reference signs refer to corresponding elements throughout the detailed description. When herein using reference signs indexed with a letter what is referred to is an exemplary embodiment of a feature that may be configured differently according to the present disclosure.

Figure 1:
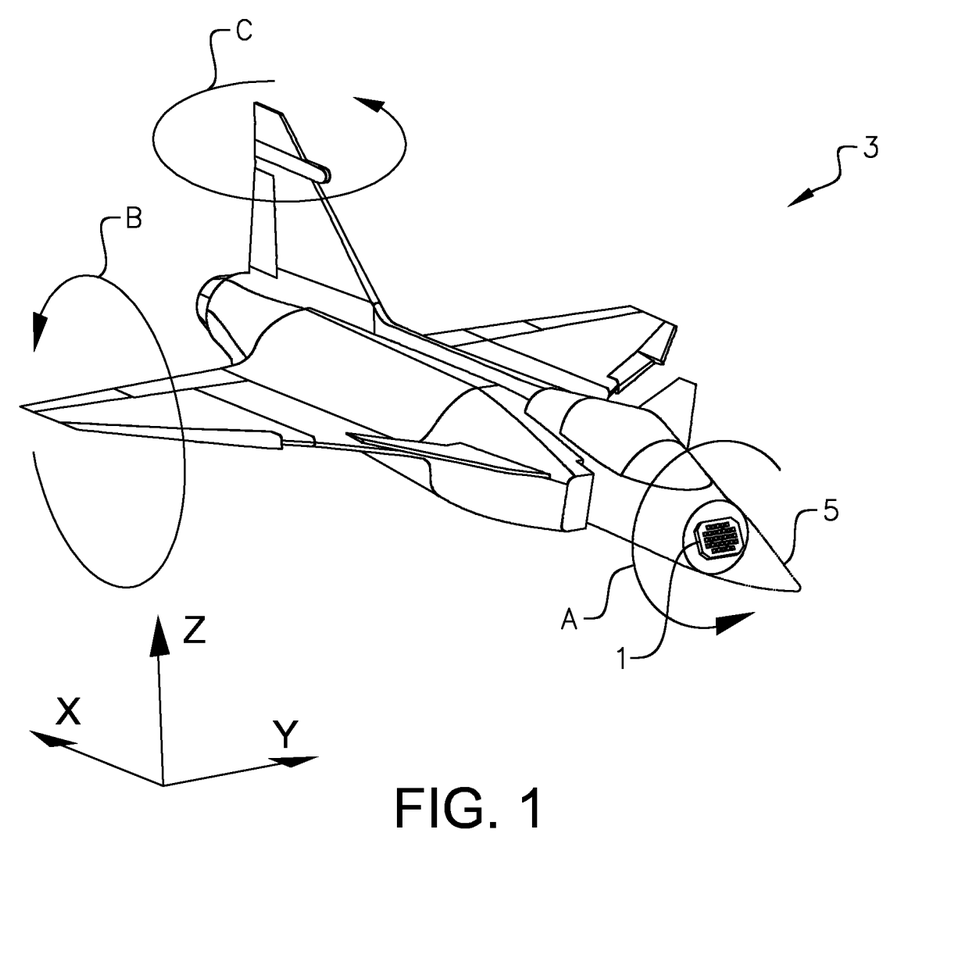
FIG. 1 discloses a schematic view of an aircraft provided with an active electronically scanned array, FIG. 2 discloses a schematic view of a first exemplary embodiment of a cooling device, FIG. 3 discloses a schematic view of a first exemplary embodiment of a cooling device 10 shown in a cut away view, FIG. 4 discloses a schematic view of a second exemplary embodiment of a cooling device 10 shown in a cut away view, FIG. 5 discloses a schematic view of an exemplary fluid flow distribution in an exemplary embodiment of a cooling device, and FIG. 6 discloses a schematic view of a circuit board and cooling device assembly.

FIG. 1 discloses a schematic view of an aircraft 3 provided with an active electronically scanned array 1 arranged in a nose cone 5 of the aircraft 3. The space available in the nose cone 5 is obviously limited, and the electronically scanned array 1, except for having to fulfil the space requirements, also needs to be lightweight, robust and be able to withstand significant pressure etc.

Electronically scanned arrays 1 are highly advanced and comprise numerous temperature sensitive components, such as e.g. printed circuit boards, soldered terminals and plastic details. At the same time many of the components of electronically scanned arrays 1 are high power components with significant power flows. The significant power flows of the high power components generates heat locally that needs to be dissipated and removed. The often complex design of AESAs further has the effect that the availability of cooling fluid (herein generally referred to as fluid flow) is restricted and that the flow rates often are relatively low. Also, for certain applications the cooling fluid has a relatively high lowest temperature, whereby sufficient cooling has to be obtained from small temperature differences between ingoing and outgoing cooling fluid.

The trajectory of an aircraft 3 in flight has three degrees of freedom X, Y, Z, and the attitude along the trajectory has three degrees of freedom, pitch B, roll A and yaw C, whereby the movements of an aircraft 3 totally has six degrees of freedom.

Figure 2:
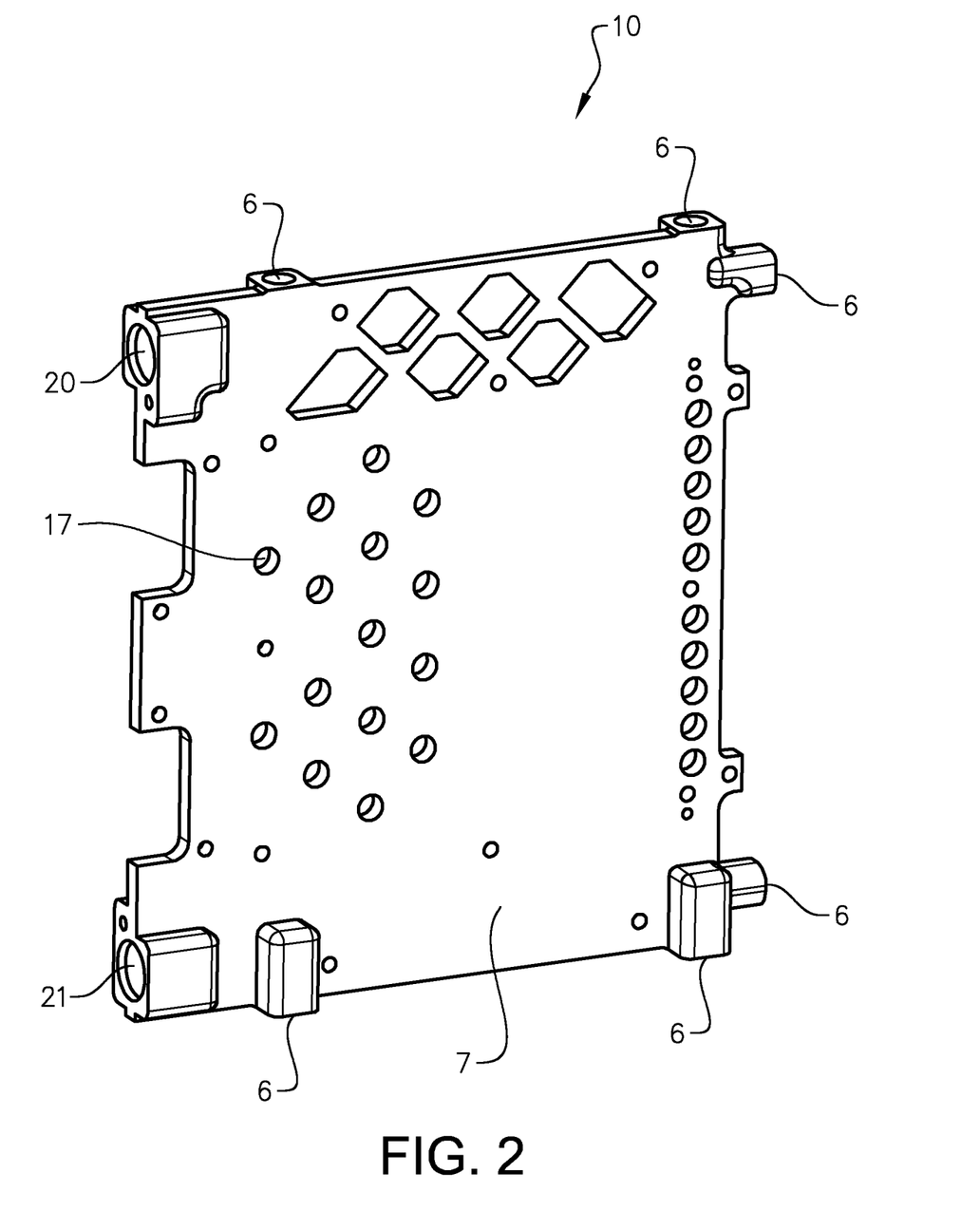

FIG. 2 discloses a schematic view of a first exemplary embodiment of a cooling device 10. The exemplary embodiment of a cooling device 10 consists of an essentially flat, hollow chamber 7. The cooling device further comprises an inlet connection 20 and an outlet connection 21. The essentially flat, hollow chamber 7 may e.g. be formed by a solid body, manufactured by means of e.g. 3D printing, or the essentially flat, hollow chamber 7 may be formed by a chamber body and an interacting chamber closure soldered together by means of e.g. salt-bath dip brazing.

FIG. 2 further discloses a plurality of screw fastenings 6 arranged at the outer perimeter of the cooling device 10. The screw fastenings 6 are provided in order to facilitate assembling of the cooling device 10 in a layered cooling structure. The number of, and positioning of, screw fastenings are preferably adapted according to current application, as is the shape and size of the cooling device 10.

The exemplary embodiment of the cooling device 10 of FIG. 2 further comprises a number of spacer elements 17 in form of through holes. As will be discussed and described more in detail below, spacer elements 17 may be configured differently. The main purposes with spacer elements 17 are to provide mechanical strength to the structure of the cooling device 10 and to disturb laminar fluid flow within the cooling device 10 and thereby counteracting the formation of boundary layers. Please note, FIG. 2 discloses an in many aspects differently configured, in terms of e.g. positioning of spacer elements 17, exemplary embodiment of a cooling device 10 than disclosed in the below disclosed FIG. 3 to FIG. 6.

Figure 3:
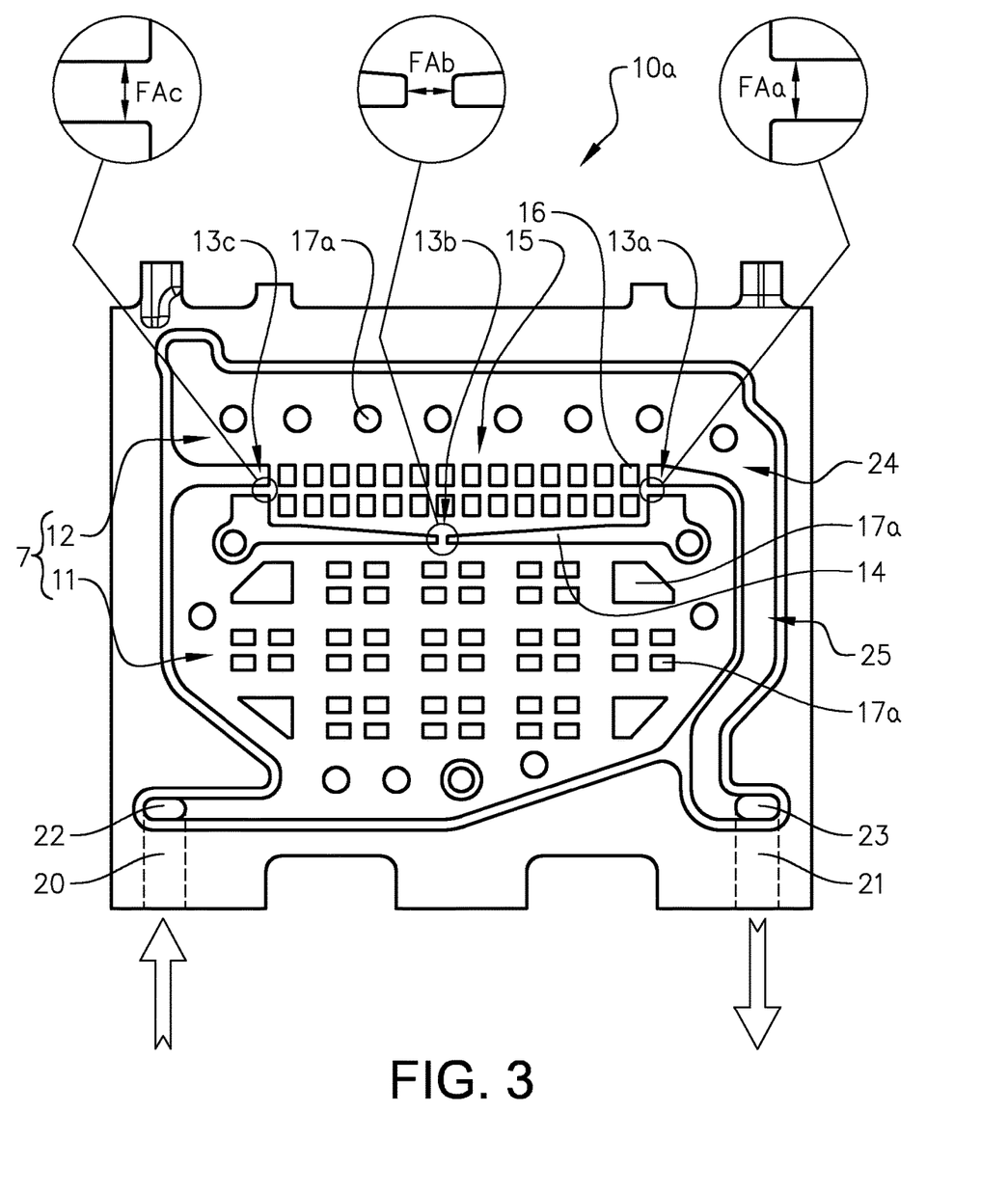

FIG. 3 discloses a schematic view of a first exemplary embodiment of a cooling device 10a shown in a cut away view. The cooling device 10a comprises an inlet 22, opening up to a distribution chamber 11, a chamber outlet 24 fluidly connected to an outlet 23 by an outlet conduit 25, wherein the chamber outlet 24 further is fluidly connected to a cooling chamber 12. The inlet 22 of the distribution chamber 11 is configured to be fluidly connected to an inlet connection 20, wherein the inlet connection 20 is configured to connect the inlet 22 to a cooling system (not shown), and the outlet 23 to an outlet connection 21, wherein the outlet connection 21 is configured to connect the outlet 23 to the cooling system (not shown). The cooling system (not shown) is e.g. configured to provide cooling fluid to the cooling device 10a. The distribution chamber 11 is separated from the cooling chamber 12 by means of a partitioning member 14. The distribution chamber 11 is fluidly connected to the cooling chamber 12 by means of a plurality of constriction passages 13 of the partitioning member 14. The exemplary embodiment of a cooling device 10a according to FIG. 3 comprises a first, a second and a third constriction passage 13a, 13b, 13c, having a first, second and third predetermined cross sectional flow areas FAa, FAb, FAc. By controlling the size of respective predetermined cross sectional flow area FAa, FAb, FAc, meaning the planar extension in a direction essentially perpendicular to the flow direction of a fluid flow through respective constriction passage 13a, 13b, 13c and thereby controlling the volume of cooling fluid that is allowed to pass through respective constriction passage 13a, 13b, 13c, the fluid flow through respective constriction passage 13a, 13b, 13c can be controlled.

When herein referring to cross sectional flow area the area, or corresponding area, disclosed as first, second and third cross sectional flow area FAa, FAb, FAc of the first, second and third constriction passage 13a, 13b, 13c is what is considered.

When entering the distribution chamber 11 the cooling fluid adopts a laminar flow due to low flow rates of cooling fluid. The low flow rates are a result of that the access to cooling fluid is limited and that the space available for the cooling device is restricted. Likewise, when the cooling fluid enters the cooling chamber 12 the cooling fluid adopts laminar flow. At laminar flow a boundary layer is formed between the walls of, in this case, the cooling device and the, in this case, cooling fluid. The boundary layer is formed by a nearly stationary fluid close to the wall. Such boundary layer has an isolating effect, thus has a negative impact on the heat transfer between the cooling fluid and the walls of the cooling device 10a.

A fluid, preferably a cooling fluid, having a temperature lower than a structure arranged adjacent to or in connection to the cooling device 10a, may enter the cooling device 10a via the inlet connection 20, enter the distribution chamber 11 via the inlet 22, flow through the distribution chamber 11, via the constriction passages 13a, 13b, 13c of the partitioning member 14, through the cooling chamber 12 to the chamber outlet 24, flow through the outlet conduit 25 to the outlet 23 and finally be discharged through the outlet connection 21, whereby the cooling device 10a may be cooled down by the fluid flow and consequently exert a cooling effect on the structure arranged adjacent to or in connection to the cooling device 10a.

The cooling chamber 12 comprises a cooling structure 15 formed by a number of surface enlarging elements 16. The surface enlarging elements 16 of the exemplary embodiment of FIG. 3 are square shaped but they surface enlarging elements 16 may also be of other shapes. The purpose of the surface enlarging elements 16 is to provide such that a larger area of the body of the cooling device 10a is exposed to cooling fluid whereby the cooling device 10a more efficiently can be cooled down by the cooling fluid. Yet an advantage with the surface enlarging elements 16 is that they disturb the laminar flow formed when the cooling fluid enters the cooling chamber 12. By disturbing the fluid flow formed the forming of a boundary layer is disturbed whereby the heat transfer between the cooling device 10a, in this case the surface enlarging elements 16 of the cooling device 10a, and the cooling fluid is improved.

The cooling device 10a is further provided with a number of spacer elements 17a. In the exemplary embodiment disclosed in FIG. 3 both the distribution chamber 11 and the cooling chamber 12 are provided with spacer elements 17a. The spacer elements 17a of FIG. 3 are provided as a number of solid bodies extending between the outer layers of the cooling device 10a. As previously stated, the main purposes of the spacer elements 17a are to provide mechanical strength to the structure of the cooling device 10a and to disturb the fluid flow and thereby counteracting the formation of boundary layer. As is apparent for a person skilled in the art, the shapes and positioning of the spacer elements 17a may be configured according to various alternatives. What determines the configuration and positioning of the spacer elements 17a is e.g. the desired cooling properties of the cooling device 10a and required mechanical strength, which in turn e.g. is dependent on the implementation of the cooling device 10a.

According to the exemplary embodiment of FIG. 3 the partitioning member 14 is provided with three constriction passages 13a, 13b, 13c. The number and configuration of constriction passages may e.g. be determined by required cooling capability, available flow of cooling fluid, the configuration of the constriction passages and the overall design in terms of e.g. shape and size of the cooling device, properties which in turn also are dependent on and determined by considered implementation of the cooling device.

By controlling the fluid flow from the distribution chamber 11 to the cooling chamber 12 by means of the constriction passages 13a, 13b, 13c, and configuring the surface enlarging elements 16 of the cooling structure 15 such that the fluid flow is distributed over the surface enlarging elements 16 accurately (see further explanation below) it is possible to control and direct the cooling effect the cooling device 10a exerts on the structure arranged adjacent to or in connection to the cooling device 10a. E.g. an area of an essentially flat cooling device 10a arranged adjacent to high power components of an adjacently arranged structure, such as e.g. a circuit board, which generates significant amount of heat, or being particularly heat sensitive, may be cooled down efficiently by means of the directed cooling capability offered by the cooling device 10a of the present disclosure. For such circuit board it is desirable that the most heat sensitive components and/or most heat generating components are arranged adjacent to the cooling structure 15 of the cooling device 10a for maximum utilization of the cooling capability provided.

What is considered to be an accurate distribution of cooling fluid over the cooling structure 15 is defined as, given the requirements the cooling device 10a is configured to fulfil, sufficient, evenly distributed and directed cooling capability. The number of constriction passages 13a, 13b, 13c, three in the exemplary embodiment of FIG. 3, should be sufficient to provide enough cooling fluid to the cooling structure 15 such that the cooling structure 15 is exposed to cooling fluid having essentially the same temperature. Thereby the cooling structure 15 will provide an even cooling of adjacent arrangements. Thus, no—what herein is referred to as—temperature gradient, meaning a significant drift in temperature over a defined area, is shown over the cooling structure 15. Of obvious reasons the temperature cannot be exactly constant, not momentarily and not over time, but small variations not having significant impact on the overall cooling functionality of the cooling device 10a are allowable. The surface enlarging elements 16 of the cooling structure 15 have the effect that they disturb the laminar flow formed when the cooling fluid enters the cooling chamber 12. Thereby the formation of boundary layers counteracted and thereby the heat transfer between the cooling fluid and the cooling device 10a is improved. Also, the surface enlarging elements 16 helps in distributing the cooling fluid evenly over the cooling structure 15 and may also, if an air pocket is formed at the cooling structure 15, provide a buffering effect. By arranging the surface enlarging elements 16 at a carefully selected distance from the outlet of respective constriction passage 13a, 13b, 13c, given the particular characteristics of e.g. the realization and positioning of the constriction passages 131, 13b, 13c and the realization, configuration and positioning of the surface enlarging elements 16, the cooling properties of the cooling device 10a can be controlled. Suitable configuration of e.g. spacer elements 17, constriction passages 13a, 13b, 13c, surface enlarging elements 16 etc. for a particularly implementation and for particular desired cooling characteristics can be determined e.g. by means of computer simulation or testing. How such simulation and testing is conducted is considered to be common general knowledge and is not further disclosed herein.

Figure 4:
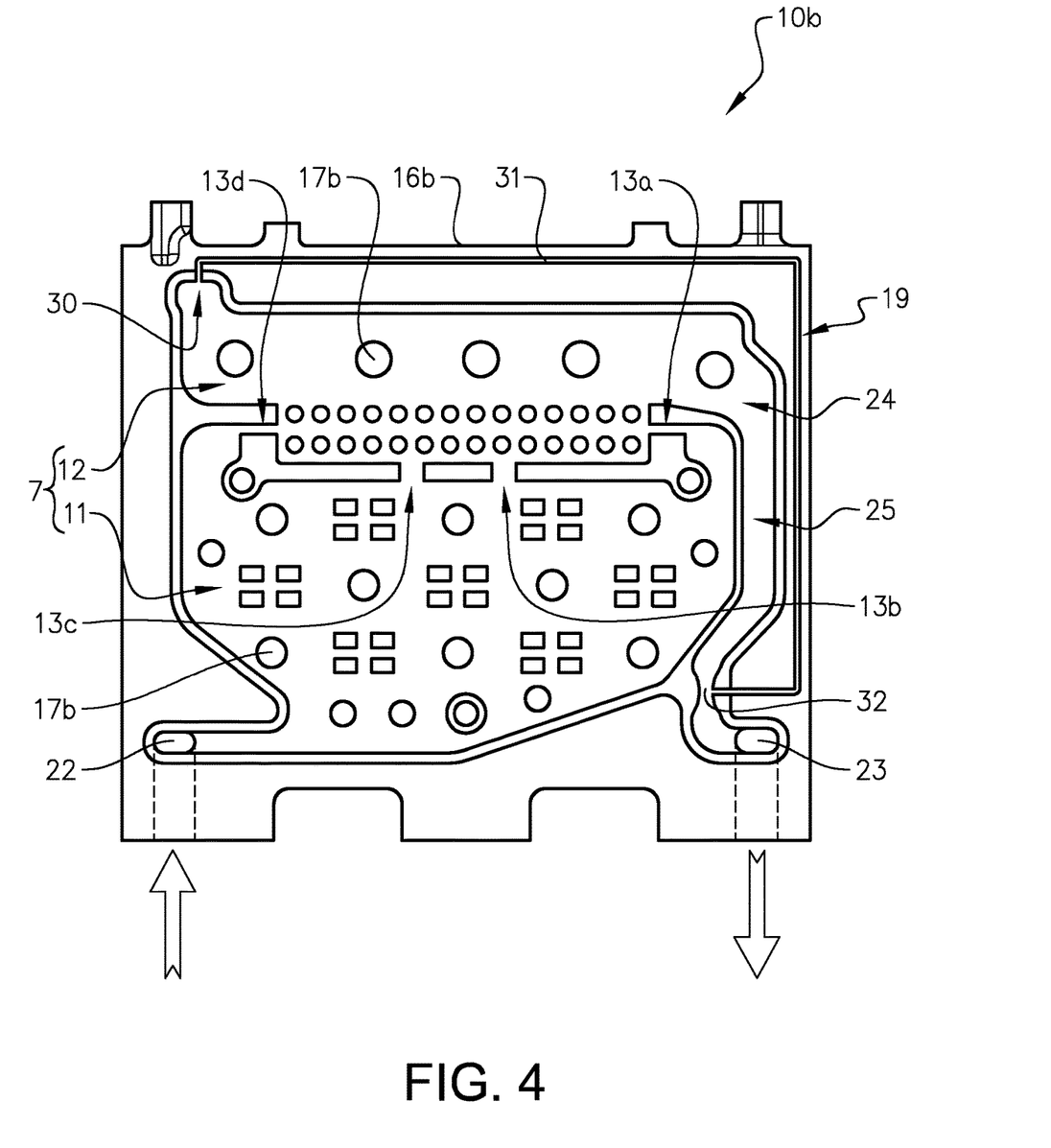

Referring now to FIG. 4, disclosing a schematic view of a second exemplary embodiment of a cooling device 10b shown in a cut away view.

The exemplary embodiment of a cooling device 10b of FIG. 4 comprises a first, a second, a third and a fourth constriction passage 13a, 13b, 13c, 13d. As previously stated, the number of constricted passages is e.g. dependent on the specific configuration and implementation of the particular cooling device 10b.

Further, according to the exemplary embodiment of a cooling device 10b of FIG. 4 the surface enlarging elements 16b are circular and the spacer elements 17b are in form of circular through holes.

As disclosed in FIG. 1, cooling devices 10b according to the present invention can preferably be used to provide cooling of high power components of electronically scanned arrays 1 arranged in an aircraft 3.

As previously discussed, the movements of an aircraft have six degrees of freedom. Thus, the orientation in of the aircrafts 3, and thereby of the electronically scanned array 1 with the cooling device 10b, may vary significantly and change continuously with the movements and orientation of the aircraft 3.

Generally, for closed spaces flowed by a fluid exposed to rapid changes of orientation there is a risk that air pockets may be formed. If air pockets are formed in a cooling device, wherein variations in temperature and/or pressure also contribute to that gas bubbles may be formed in the fluid, similar to the cooling device as of the present invention the cooling capability of such cooling device may be locally lost which may have catastrophic consequences.

The schematic view of a second exemplary embodiment of a cooling device 10b resembles the first exemplary embodiment of a cooling device 10a of FIG. 3 in many aspects. However, the cooling device 10b of FIG. 4 additionally comprises a deaeration device 19.

The deaeration device 19 comprises a deaeration conduit 31 connecting a gas drainage cavity 30 with the outlet conduit 25, at a position of the outlet conduit 25 close to the outlet 23. A venturi tube 32 is arranged in the outlet conduit 25. The gas drainage cavity 30 is arranged such as during the most frequent mode of operation, i.e. the most frequent orientation, air bubbles formed in the cooling fluid, or provided to the chamber 7 with the cooling fluid, are accumulated in the gas drainage cavity 30. A venturi tube 32 is a constricted section of a tube, also referred to as a choke, in which an under pressure is formed if the flow rate in the outlet conduit 25 is sufficiently high (the Venturi effect), whereby a suction force is created in the connected deaeration conduit 31. The suction force created by the venturi tube 32 provides such that gas accumulated in the gas drainage cavity 30 is drawn out, thereby providing an efficient deaeration functionality of the cooling device 10b.

The deaeration device 19, securing that no air pockets are formed in the cooling device 10b, provides such that sufficient cooling capability is provided by the cooling device 10b independently of orientation, and rapid change of orientation, of the cooling device 10b.

Figure 5:
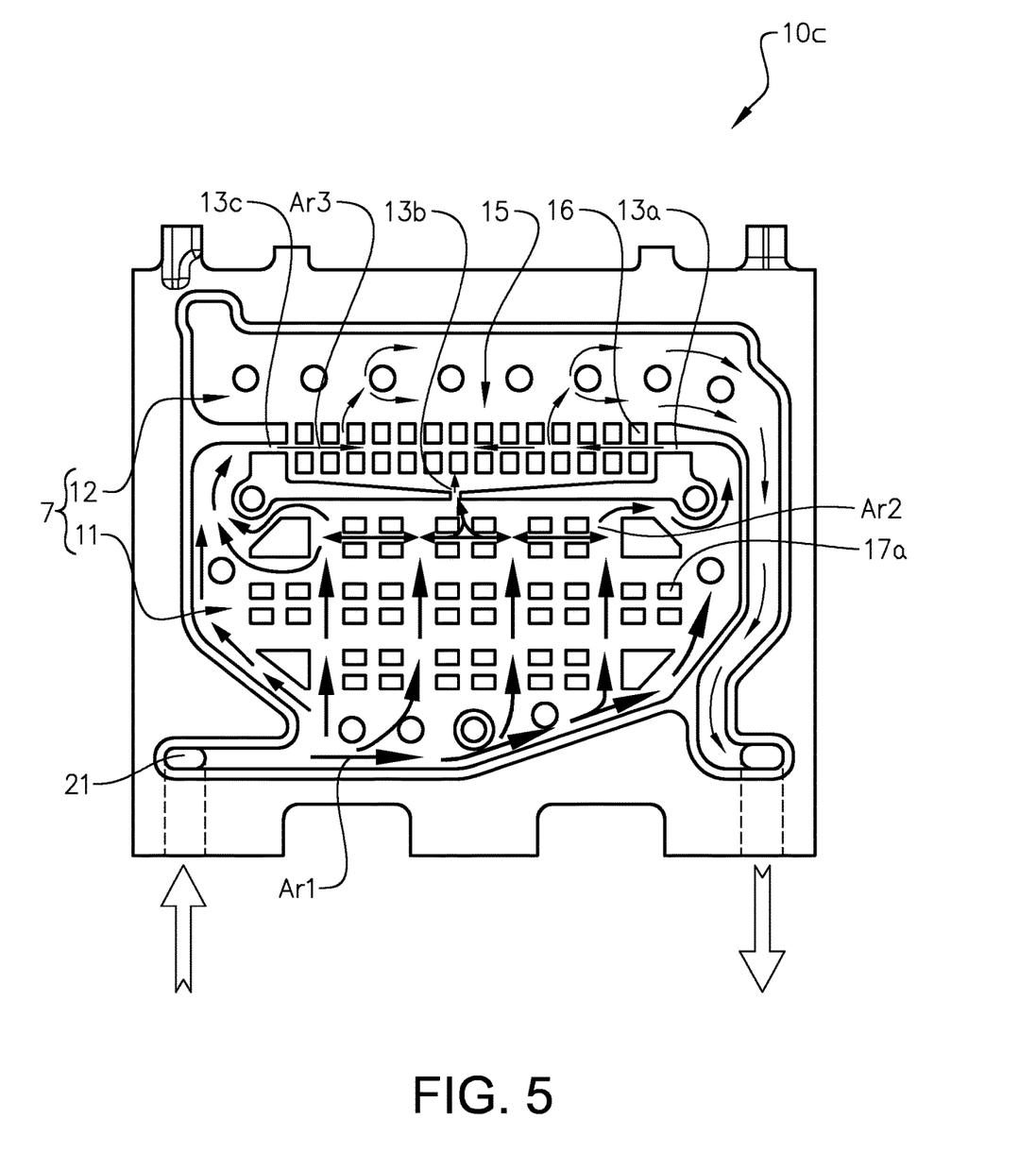

FIG. 5 discloses an exemplary, schematic view of a fluid flow distribution in an exemplary embodiment of a cooling device 10c in order to further explain one of the main inventive concepts of the present invention. A fluid flow, preferably by a cooling fluid, entering the inlet will have a certain flow direction, in FIG. 5 indicated by the arrows Ar1. In the exemplary embodiment disclosed in FIG. 5 the fluid flow can be considered to be distributed over a number of main flow passageways that are formed in the distribution chamber 11 of the cooling device 10c. The partitioning member 14 of the exemplary embodiment of a FIG. 5 comprises a first, a second and a third constriction passage 13a, 13b, 13c configured to restrict the flow through respective passage. The constriction passages 13a, 13b, 13c of the exemplary embodiment of FIG. 5 are configured such that the fluid flow through respective constriction passage 13a, 13b, 13c is essentially equal, however according to other embodiments the flow over the different constriction passages may be different.

The restriction in terms of flow through respective constriction passage 13a, 13b, 13c forces the fluid flow to be distributed throughout the distribution chamber 11 where e.g. spacer elements 17a will improve the mixing of the cooling fluid. The distribution throughout the distribution chamber 11 is schematically indicated by the arrows Ar2. This has the effect, as also is indicated by arrows Ar2, that essentially a third of the fluid flow will be distributed to the cooling chamber 12 through respective first, second and third constriction passages 13a, 13b, 13c. Thereby the fluid flow being provided to the cooling structure 15 of the cooling chamber 12, as is indicated by arrows Ar3, will be essentially equally distributed, wherein the distribution of fluid flow over the surface enlarging elements 16 of the cooling structure 15 will be essentially even.

As previously discussed, the cooling fluid will have an essentially laminar flow in the distribution chamber 11 and in the cooling chamber 12, even if the flow locally may be turbulent due to narrow passages, sharp corners etc.

Please note that this is an extremely simplified description of how the fluid flow within the chamber 7 works provided merely to further explain one of the main inventive concepts of the present invention. In this extremely simplified description no consideration is e.g. taken to the spacer elements 17a of the distribution chamber 11 of the cooling device, or to potential fluid swirls formed.

Figure 6:
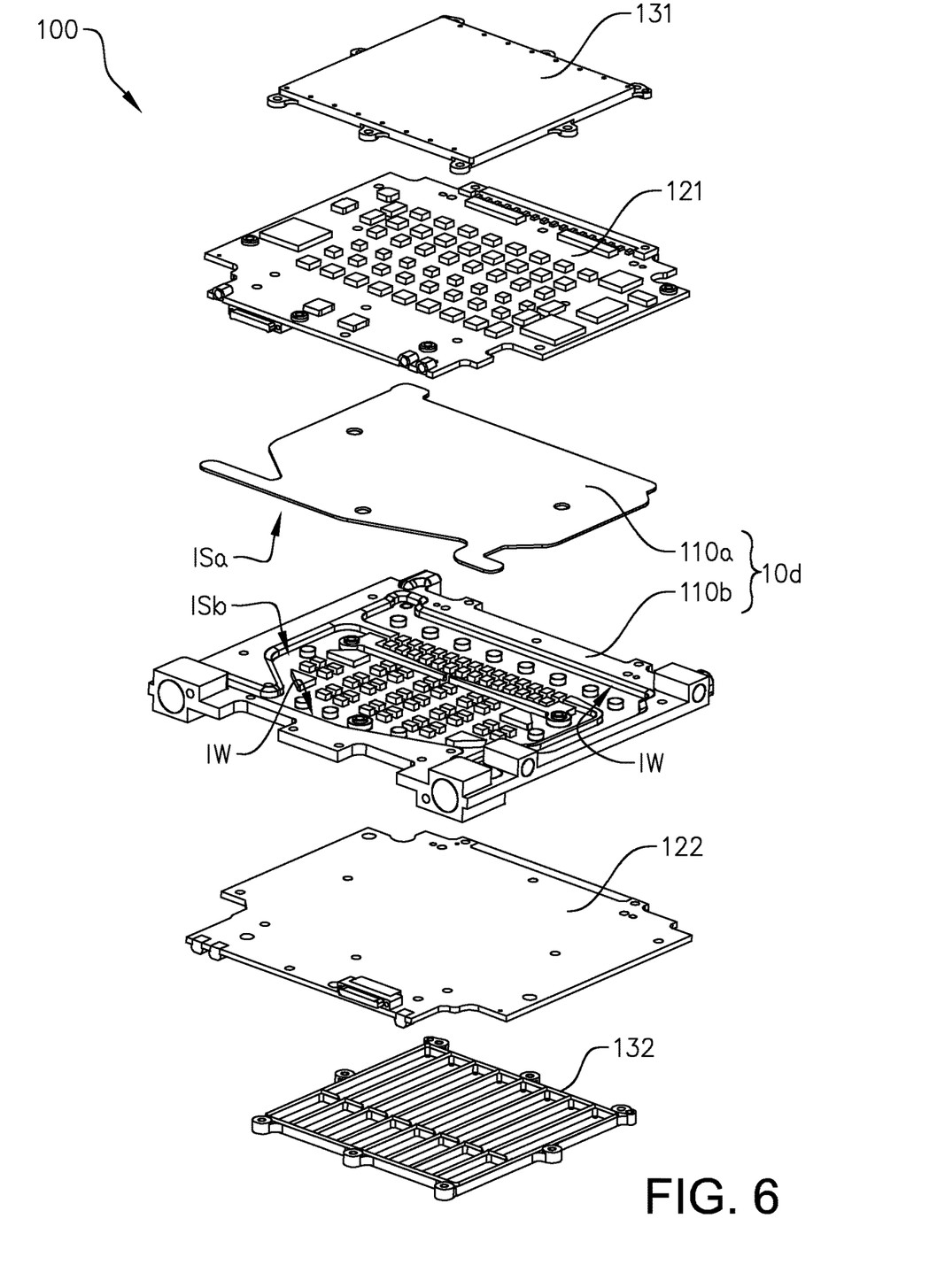

FIG. 6 discloses a schematic view of a circuit board and cooling device assembly 100 in a layered cooling structure. The cooling device 10d of the exemplary embodiment of FIG. 6 comprises a chamber body 110b and a chamber closure 110a, together forming the cooling device 10d. The cooling device 10d is arranged between a first circuit board 121 and a second circuit board 122, wherein the cooling device 10d provides cooling of the first and second circuit boards 121, 122. The first circuit board 121, the cooling device 10d and the second circuit board 122 are further enclosed by a first and second outer housing 131, 132, providing mechanical support.

FIG. 6 also schematically indicates an example of what can be considered to be a first inner surface ISa and a second inner surface ISb. First and second is here simply a way of separating the two inner surfaces ISa, ISb of the chamber of the cooling device 10d from one another. Obviously, what herein is referred to as the first inner surface may just as well be referred to as the second inner surface and what herein is referred to as the second inner surface may just as well be referred to as the first inner surface. In FIG. 6 is also a circumferential inner wall IW, extending from an outer edge of the first inner surface ISa to an outer edge of the second inner surface ISb, and connecting the first inner surface ISa to the second inner surface ISb, such that an essentially planar hollow chamber is formed, schematically indicated.

This is just an example of a circuit board and cooling device assembly 100. Obviously, an assembly may also comprise e.g. one circuit board and one cooling device or, if necessary considering the application, one circuit board and two cooling devices.

When herein referring to the first, second, third and fourth constriction passage, having first, second, third and fourth cross sectional flow areas, it is just a way to be able to separate respective constriction passage (having a specific cross sectional flow area) from one another and be able to discuss them separately. The numbering should not be seen as limiting, merely as a convenient way to separate respective constriction passage. Obviously, what herein is referred to as e.g. the first constriction passage might as well be referred to as e.g. the second constriction passage.

The invention claimed is:

1. Cooling device for providing cooling capability of adjacent structures comprising:
   a hollow chamber,
   an inlet, and
   a chamber outlet,
   wherein the inlet, the chamber and the chamber outlet are configured such that fluid flow may enter via the inlet, pass through the chamber, and exit via the chamber outlet,
   characterized in that
   the chamber is divided into a distribution chamber and a cooling chamber by a partitioning member, wherein the inlet is fluidly connected to the distribution chamber and the chamber outlet is fluidly connected to the cooling chamber, and wherein
   the partitioning member comprises at least a first and a second constriction passage, wherein the first constriction passage has a first predefined cross sectional flow area, and wherein
   the second constriction passage has a second predefined cross sectional flow area, and wherein
   the sizes of the predefined first and second cross sectional flow areas of the first and second constriction passages are controllable, whereby the distribution of fluid flow' from the distribution chamber to the cooling chamber via the respective constriction passage is controllable,
   wherein the cooling device further comprises:
   a gas drainage cavity, wherein the gas drainage cavity is arranged such that gas in the fluid flow is collected in the gas drainage cavity,
   an outlet wherein an outlet conduit fluidly connects the outlet to the chamber outlet, and
   a deaeration device comprising a deaeration conduit provided with a venturi tube, wherein the deaeration device is fluidly connected to the gas drainage cavity at one end of the deaeration conduit and fluidly connected to the outlet conduit at the other end of the deaeration conduit.

2. Cooling device according to claim 1, wherein the partitioning member additionally comprises at least a third constriction passage, wherein
   the third constriction passage has a third predefined cross sectional area, and wherein
   the sizes of the predefined first, second and third cross sectional flow areas of the first, second and third constriction passages are controllable, thereby the distribution of fluid flow from the distribution chamber to the cooling chamber via the respective constriction passage is controllable.

3. Cooling device according to claim 1, wherein the predefined cross sectional flow areas of the constriction passages are configured to control fluid flow through respective constriction passage such that fluid flow through respective constriction passage is essentially equal, whereby fluid flow from the distribution chamber to the cooling chamber is essentially evenly distributed over the constriction passages.

4. Cooling device according to claim 1, wherein the cooling chamber comprises a cooling structure, wherein the cooling structure is formed by a number of surface enlarging elements, and wherein
   the predefined cross sectional flow areas of the constriction passages are configured such that the fluid flow distributed from the distribution chamber to the cooling chamber is essentially evenly distributed over the surface enlarging elements of the cooling structure by means of the constriction passages.

5. Cooling device according to claim 4, wherein the chamber is defined by:
- a first inner surface and a second inner surface, wherein the first and second inner surfaces are essentially parallel, and
- an inner wall extending from an outer edge of the first inner surface to an outer edge of the second inner surface, and connecting the first inner surface to the second inner surface, such that an essentially planar hollow chamber is formed, wherein
- the surface enlarging elements extend from the first inner surface of the planar chamber to the second inner surface of the planar chamber.

6. Cooling device according to claim 4, wherein the surface enlarging elements are formed as
- essentially circular cylinders extending from a first inner surface to a second inner surface of the chamber, or
- essentially quadratic blocs extending from the first inner surface to the second inner surface of the chamber, or
- at least one shape from a group of shapes consisting of: an hourglass, a helix, a barrel,
- wherein the shape is extending from e first inner surface to the second inner surface of the chamber.

7. Cooling device according to claim 1, wherein the distribution chamber comprises at least one spacer element, or wherein the cooling chamber comprises at least one spacer element, or wherein the distribution chamber and the cooling chamber comprises at least one spacer element each, wherein the spacer elements extends from a first inner surface to a second inner surface of the chamber and thereby provide mechanical stability to the cooling device.

8. Cooling device according to claim 4, wherein the plurality of surface enlarging elements are separated by a distance of at least 0.5 mm, and wherein the planar extension in any direction of the cross sectional area of the constriction passages are at least 0.5 mm.

9. Cooling device according to claim 1, wherein the chamber is made of a heat conductive material.

10. Cooling device according to claim 9, wherein the heat conductive material is aluminium, copper, graphene composite or an alloy comprising aluminium or copper.

11. Cooling device according to claim 1, wherein the chamber is manufactured by means of 3D printing.

12. Cooling device according to claim 1, wherein the hollow chamber comprises a chamber body and a chamber closure, wherein the chamber body and the chamber closure are configured to fit together whereby a hermetically sealed hollow chamber is formed.

13. Cooling device according to claim 12, wherein a chamber body and a chamber closure are manufactured by means of 3D printing.

14. Cooling device according to claim 12, wherein a chamber body and a chamber closure are soldered together by means of salt-bath dip brazing.

* * * * *